(12) United States Patent
Li et al.

(10) Patent No.: US 7,666,702 B2
(45) Date of Patent: Feb. 23, 2010

(54) METHOD FOR FABRICATING A MICROSTRUCTURE

(75) Inventors: Sheng-Hung Li, Hsinchu (TW); Siew-Seong Tan, Hsinchu (TW); Cheng-Yen Liu, Hsinchu (TW); Li-Ken Yeh, Hsinchu (TW)

(73) Assignee: MEMSmart Semiconductor Corp., Hsinchu (TW)

( * ) Notice: Subject to any disclaimer, the term of this patent is extended or adjusted under 35 U.S.C. 154(b) by 275 days.

(21) Appl. No.: 11/946,831

(22) Filed: Nov. 28, 2007

(65) Prior Publication Data

US 2009/0137113 A1    May 28, 2009

(51) Int. Cl.
*H01L 21/00* (2006.01)
*H01L 21/4763* (2006.01)
*G02B 26/00* (2006.01)

(52) U.S. Cl. .............. 438/52; 438/637; 257/E21.495; 257/E21.499; 359/290

(58) Field of Classification Search .............. 438/637, 438/52, 222, 127, 114, 106; 29/841; 257/729, 257/E21.495, E21.499; 359/290, 291
See application file for complete search history.

(56) References Cited

U.S. PATENT DOCUMENTS

| | | | |
|---|---|---|---|
| 2005/0195463 A1* | 9/2005 | Murata | 359/290 |
| 2006/0285191 A1* | 12/2006 | Yang | 359/290 |
| 2009/0137113 A1* | 5/2009 | Li et al. | 438/637 |
| 2009/0229369 A1* | 9/2009 | Tan | 73/780 |
| 2009/0243084 A1* | 10/2009 | Tan | 257/704 |

* cited by examiner

*Primary Examiner*—Walter L Lindsay, Jr.
(74) *Attorney, Agent, or Firm*—Shia, Banger

(57) ABSTRACT

A method for fabricating a microstructure is to form at least one insulation layer including a micro-electro-mechanical structure therein over an upper surface of a silicon substrate. The micro-electro-mechanical structure includes at least one microstructure and a metal sacrificial structure that are independent with each other. In the metal sacrificial structure are formed a plurality of metal layers and a plurality of metal via layers connected to the respective metal layers. A barrier layer is formed over an upper surface of the insulation layer, and an etching stop layer is subsequently formed over a lower surface of the silicon substrate. An etching operation is carried out from the lower surface of the silicon substrate to form a space corresponding to the micro-electro-mechanical structure, and then the metal sacrificial structure is etched, thus achieving a microstructure suspension.

7 Claims, 5 Drawing Sheets

METHOD FOR FABRICATING A MICROSTRUCTURE

BACKGROUND OF THE INVENTION

1. Field of the Invention

The present invention relates to a method for fabricating micro-electro-mechanical structure, and more particularly to a method for fabricating a microstructure, which can effectively avoid improper erosion, reduce the probability of exposure of the microstructure and further reduce the package cost.

2. Description of the Prior Art

The existing semiconductor micro-electro-mechanical systems comprises various semiconductor microstructures, such as the unmovable probe, channel, cavity structure, or the movable spring, linkage rod, gear (rigid body movement or flexible deformation), etc.

Integrating the above different structures with the related semiconductor circuit can form various semiconductor applications. Thus, how to utilize the fabricating method to improve the various functions of the microstructure is the key index of the semiconductor electromechanical system in the future and is also a rigorous challenge of further developing the chip in the future.

The existing method for fabricating the micro-electro-mechanical sensor and actuator system is often required to fabricate a suspension structure on a silicon substrate. The above process must adopt the advanced semiconductor technology, such as: high-aspect-ratio dry etching and sacrificial layer removing technology, etc.

A first conventional method disclosed in U.S. Pat. No. 6,458,615 B1 is to form at least one insulation layer including an inner micro-electro-mechanical structure on an upper surface of a silicon substrate, and then conduct a layer-by-layer etching operation from the upper surface until the lateral edge of the micro-electro-mechanical structure, and finally, conduct an isotropic dry etching to the silicon substrate to achieve the suspension of the micro-electro-mechanical structure;

The first conventional method can be used to fabricate a suspension micro-electro-mechanical structure, but it has the following disadvantages:

1. It adopts anisotropic dry chemical etching and uses chemical reaction to remove the isolation layer, however, after the side edge of the micro-electro-mechanical structure is etched, the silicon substrate still needs to be massively etched by isotropic chemical etching, and this technique will produce serious undercut problems;

2. In the process of this conventional technology, the micro-electro-mechanical structure is exposed in the process at first, after a long time of multi-layer processing, the exposed micro-electro-mechanical structure is likely to be contaminated and damaged, causing an excessively low yield rate;

3. After the etching operation is completed, the micro-electro-mechanical structure has already been capable of operating in suspension state, but a special machine will be used to pack the micro-electro-mechanical structure surface to block dust and particle. However, since the micro-electromechanical structure must be ensured in the suspension state, the conventional method is to place a special mold used as a cap over the product surface, and then precisely fabricate a package protection cap without touching the suspension micro-electro-mechanical structure. This kind of surface package is complicated and expensive, and unlikely to be integrated with the process of the common integrated circuit package.

With the rapid development of the above technology, in order to improve many problems, a second conventional method disclosed in U.S. Pat. No. 6,712,983 B2 taught the use of a reactive ion etch (hereinafter refereed to as RIE) technology. This technology is capable of greatly reducing occurrence of the undercut, but since it also conducts a layer-by-layer etching from up down, and the last etching operation of the silicon substrate must apply the isotropic etching technology, this improved conventional technology is still complicated and has the undercut problem, and some problems still have not been improved, such as the exposure of the micro-electro-mechanical structure and being not good for later package.

It is to be noted that, in the conventional top-down etching technology, the respective structures in the microstructure and the metal layer are stacked layer by layer. When fabricating a complicated multi-layer suspension microstructure, the multi-layer suspension microstructure must ensure not to be affected by multiple etching operations, and not to be damaged after being etched and exposed for a long time, and further ensure to avoid the fine structure remains of multiple etching operations.

The present invention has arisen to mitigate and/or obviate the afore-described disadvantages.

SUMMARY OF THE INVENTION

The primary objective of the present invention is to provide a method for fabricating a microstructure, which can effectively avoid improper erosion and structure remains.

In order to achieve the above objective, the method in accordance with the present invention is to form at least one insulation layer including an inner micro-electro-mechanical structure over an upper surface of a silicon substrate. The micro-electro-mechanical structure includes at least one microstructure and a metal sacrificial structure that are independent with each other. In the metal sacrificial structure are formed a plurality of metal layers and a plurality of via layers connected to the respective metal layers. A barrier layer is formed over the insulation layer, and an etching stop layer is subsequently formed over the lower surface of the silicon substrate. An etching operation is carried out from the lower surface of the silicon substrate to form a space corresponding to the micro-electro-mechanical structure, and then the metal sacrificial structure is etched to achieve a microstructure suspension.

Hence, since the surrounding of the microstructure is still protected by the barrier layer and insulation layer during etching the suspension microstructure, the time of the etching process of the micro-electro-mechanical structure is reduced, the sidewalls of the micro-electro-mechanical structure are etched less, and the probability of remaining etching fine structures is reduced.

The second objective of the present invention is to provide a method for fabricating a microstructure, which can achieve a suspension microstructure, reduce the probability of exposure, and effectively reduce the package cost.

In order to achieve the above objective, the micro-electromechanical structure in accordance with the present invention includes at least one microstructure and a metal sacrificial structure that are independent with each other. A barrier layer is formed over the upper surface of the insulation layer from inside to outside first, and then a deep reactive ion etching is carried out to form the suspension space of the microstructure. Subsequently, the metal sacrificial structure is etched to achieve the suspension of the microstructure. At this moment, the barrier layer over the upper surface of the insulation layer still exists.

When being fabricated, the microstructure is clad by the insulation layer and achieves the suspension by etching the metal sacrificial structure, which includes the metal layers and the metal via layers.

Therefore, by utilizing at least one microstructure and a metal sacrificial structure of independent with each other together with the technology of etching from the lower surface of the silicon substrate, the suspension microstructure keeps the barrier layer over the upper surface thereof during the overall fabricating process, thus effectively avoiding exposing the suspension microstructure, and reducing the probability of damage.

It is important that, the barrier layer over the upper surface of the insulation layer can directly serve as the package of the micro-electro-mechanical structure, so the complicated and expensive later package operation can be directly canceled in the present invention.

The third objective of the present invention is to provide a method for fabricating a microstructure, which can avoid the later contamination and improve the reliability.

In order to achieve the above objective, since the barrier layer over the upper surface of the insulation is preserved when the microstructure and the metal sacrificial metal structure are etched, the barrier layer in accordance with the present invention effectively protect the later operation to avoid the later contamination and improve the reliability.

It is to be noted that, the present invention partially adopts the deep reactive ion etching (hereinafter referred to as DRIE). The DRIE is the quite focused anisotropic etching technology recently, which utilizes the protective layer formed in the etching process to prevent the sidewalls from being etched, and to achieve the predetermined high-aspect-ratio. Thus, the etching structure shape is not influenced by the lattice plane and doesn't have the salient and undercut characteristic, so the cavity or the protrusion of arbitrary shape can be formed by etch. In addition, multiple heights can be formed on the surface of the substrate due to the characteristic of the reactive ion etch lag.

In addition, the barrier layer can be plated with a conductor protective layer, and the conductor protective layer can be formed with the seed layer for plating a common standard chip structure and can directly act as an electrical connection part of a circuit and act as a part of a package.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Referring to FIGS. 1-5, a method for fabricating a microstructure in accordance with a first embodiment of the present invention comprises the following steps.

Figure 1:
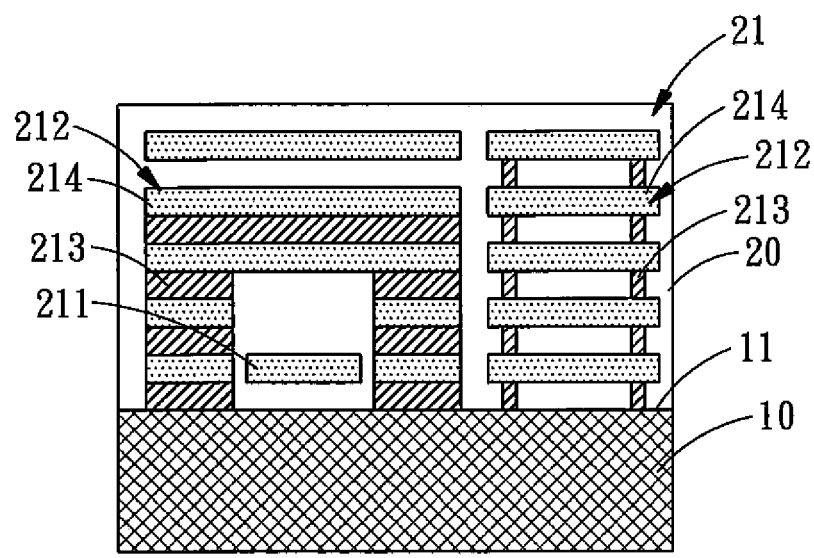
FIG. 1 is a cross sectional view showing a first step of a method for fabricating a microstructure in accordance with a first embodiment of the present invention.

As shown in FIG. 1, an insulation layer 20 including an inner micro-electro-mechanical structure 21 is formed over an upper surface 11 of a silicon substrate 10 first. The micro-electro-mechanical structure 21 includes at least one microstructure 211 and a plurality of metal sacrificial structures 212 that are independent with each other. In each metal sacrificial structure 212 are formed a metal layer 214 and a metal via layer 213 connected to the metal layer 214. The microstructure 211 is clad by the insulation layer 20. Between the respective metal layers 214 of the metal sacrificial structures 212 and the microstructure 211 are formed the respective metal via layers 213.

Figure 2:
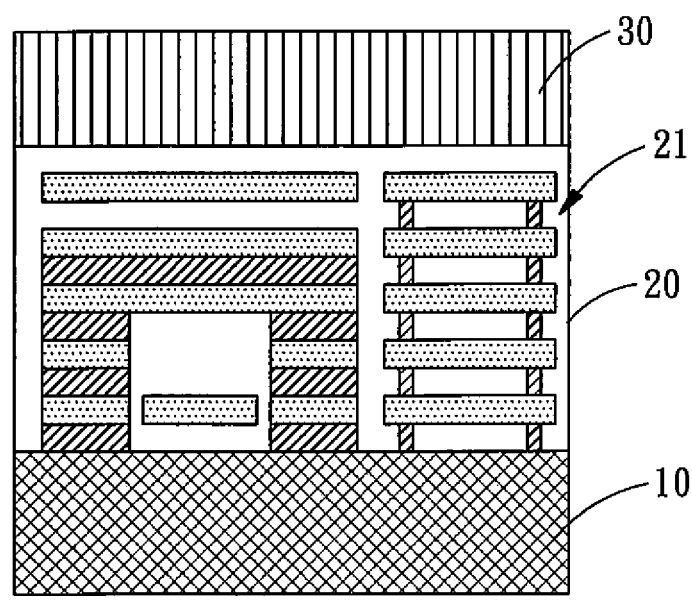
FIG. 2 is a cross sectional view showing a second step of the method for fabricating a microstructure in accordance with the first embodiment of the present invention.

As shown in FIG. 2, a barrier layer 30 is formed over an upper surface of the insulation 20.

Figure 3:
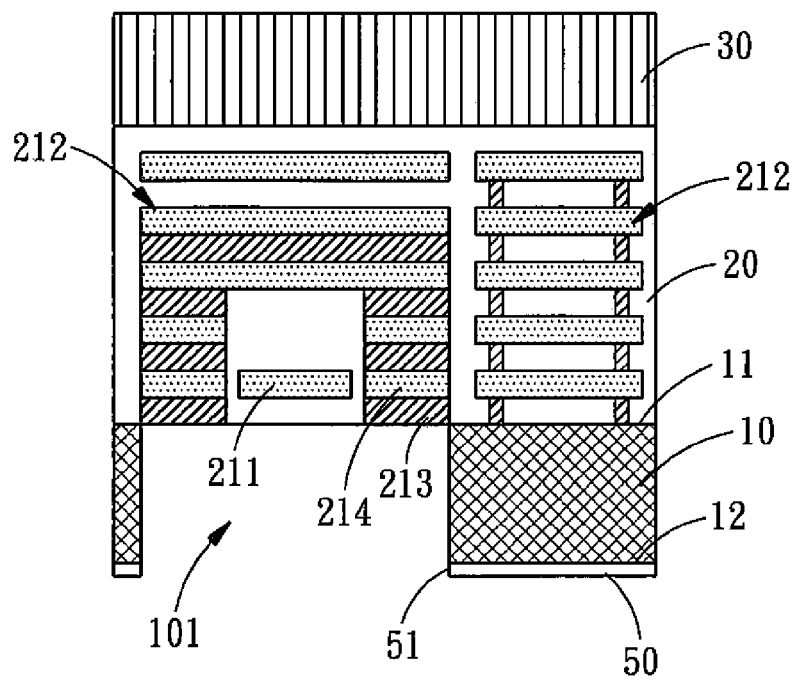
FIG. 3 is a cross sectional view showing a third step of the method for fabricating a microstructure in accordance with the first embodiment of the present invention.

As shown in FIG. 3, an etching stop layer 50 is subsequently formed over a lower surface 12 of the silicon substrate 10. An opening 51 of the etching stop layer 50 corresponds to the micro-electro-mechanical structure 21. A deep reactive ion etching (DRIE) or a wet etching operation is carried out from the lower surface 12 of the silicon substrate 10 to directionally form a space 101 corresponding to the micro-electro-mechanical structure 21, and the space 101 extends to the insulation layer 20 and the metal sacrificial structure 212.

Figure 4:
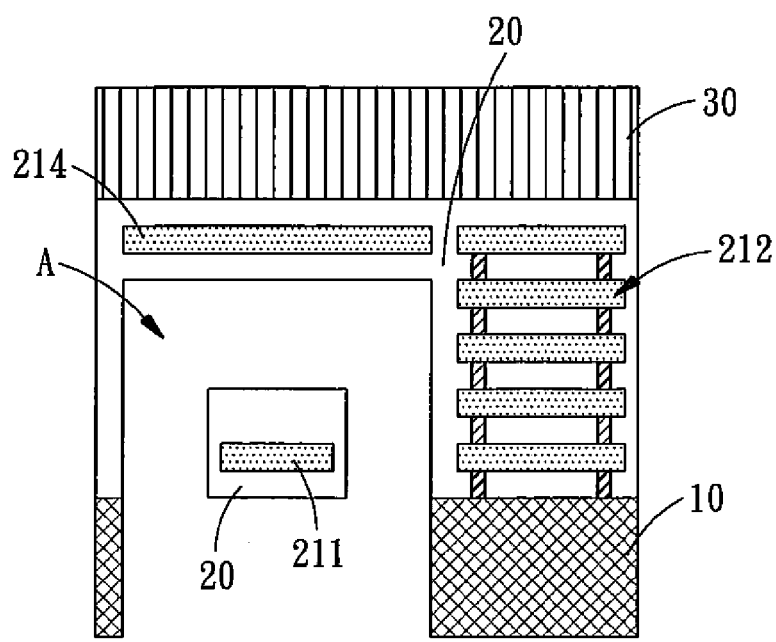
FIG. 4 is a cross sectional view showing a fourth step of the method for fabricating a microstructure in accordance with the first embodiment of the present invention.

As shown in FIG. 4, the metal sacrificial structure 212 of the insulation layer 20 is etched from the space 101 of the silicon substrate 10, and the metal sacrificial structures 212 around the microstructure 211 are removed, thus forming the required suspension space A of the microstructure 211 of the micro-electro-mechanical structure 21. This suspension space A simultaneously becomes the interval between the sacrificial structure 212 and the microstructure 211. At this moment, the surface of microstructure 211 is still clad by the insulation layer 20. Thereby, the microstructure 211 of the micro-electro-mechanical structure 21 still keeps in a good condition during suspension without being eroded. In addition, at this moment, the etching stop layer 50 is synchronously removed.

Figure 5:
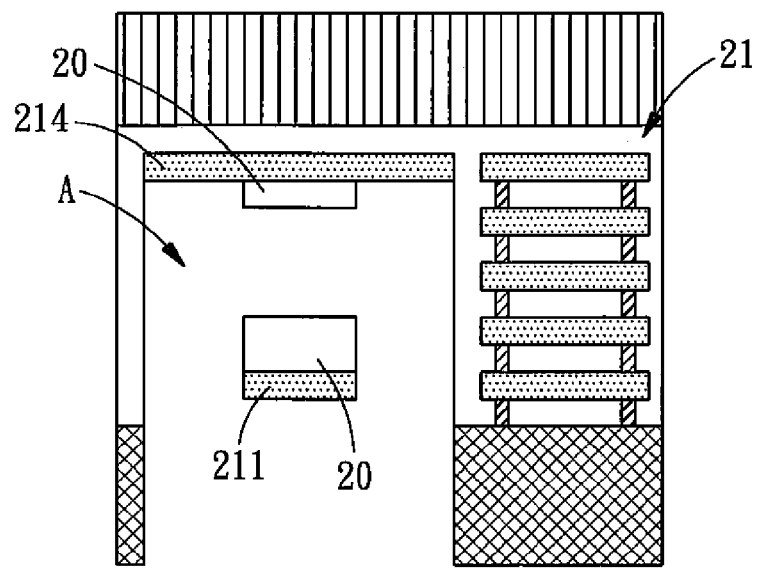
FIG. 5 is a cross sectional view showing a fifth step of the method for fabricating a microstructure in accordance with the first embodiment of the present invention.

As shown in FIG. 5, if the micro-electro-mechanical structure 21 needs exposing in the suspension space A (namely, interval) or removing the fine structure remains, the insulation layer 20 can be etched again to expose the microstructure 211 and the metal sacrificial structure 212 in the suspension space A, strengthening the sensing effect. The last etching step can remove the original etching fine structure remains.

The method for fabricating a microstructure in accordance with the first embodiment of the present invention has the following advantages:

1. Effectively avoiding undercut: By adopting the technology of carrying out a DRIE or a wet etching operation from the lower surface 12 of the silicon substrate 10, the etching applied to the exposed micro-electro structure 21 is reduced, and thus the exposed micro-electro structure 21 is etched less. Moreover, by cooperating with the dry RIE technology, the undercut can be avoided occurring at the microstructure 211 and the metal sacrificial structure 212 of the micro-electro-mechanical structure 21;

2. Reducing exposure and the possibility of damaging the micro-electro-mechanical structure and effectively reducing the package cost: since the etching is sequentially carried out from the lower surface 12 of the substrate 10, the barrier layer 40 still keeps over both the microstructure 211 and the metal sacrificial structure 212 in the insulation layer 20 from starting the process to accomplish the suspension space A, thus effectively preventing the exposure of the micro-electro-mechanical structure and reducing the possibility of damage thereof;

3. Since the barrier layer 40 over the insulation layer 21 can be directly used as a package structure, the conventional complicated and expensive package operation can be directly canceled.

Referring to FIGS. 6-9, a method for fabricating a microstructure in accordance with a second embodiment of the present invention comprises the following steps.

Figure 6:
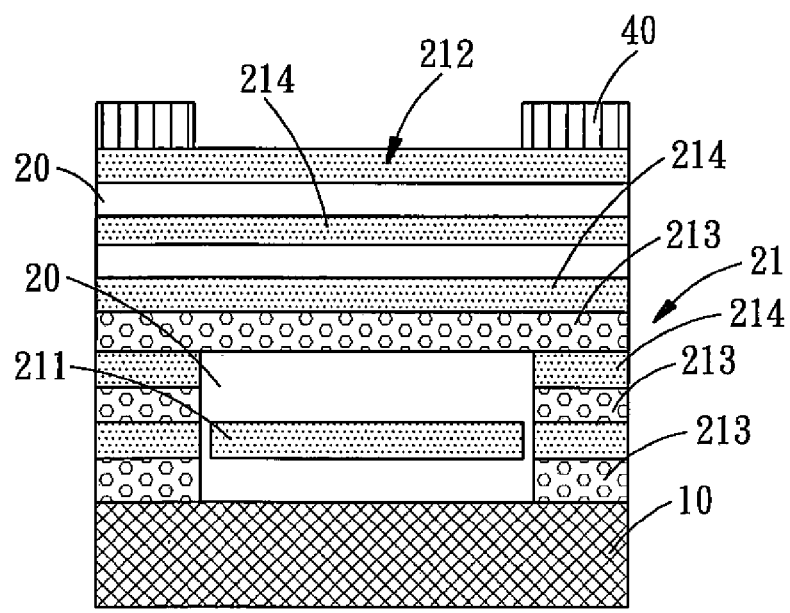
FIG. 6 is a cross sectional view showing a first step of a method for fabricating a microstructure in accordance with a second embodiment of the present invention.

As shown in FIG. 6, at least one insulation layer 20 including an inner micro-electro-mechanical structure 21 is formed over an upper surface 11 of a silicon substrate 10 first. The micro-electro-mechanical structure 21 includes at least one microstructure 211 and a metal sacrificial structure 212 that are independent with each other. The metal sacrificial structure 212 includes a plurality of metal layers 214 and a plurality of metal via layers 213. The predetermined suspension microstructure 211 is clad by the insulation layer 20. Between the microstructure 211 and the respective metal layers 214 of the metal sacrificial structure 212 are formed the respective metal via layers 213. The metal layer 214 at the most external side of the metal sacrificial structure 212 is partially exposed and not clad by the insulation layer 20. A barrier layer 40 is formed over the insulation layer 20 of the unexposed metal layer 214.

Figure 7:
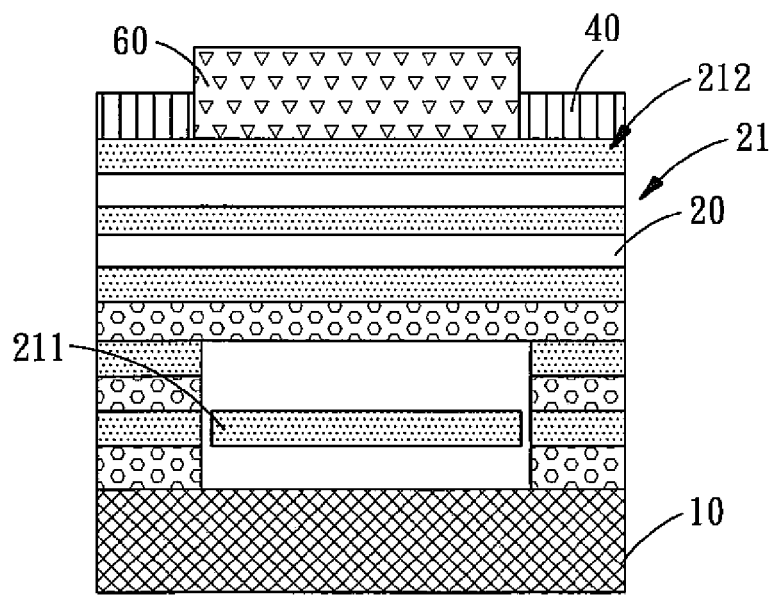
FIG. 7 is a cross sectional view showing a second step of the method for fabricating a microstructure in accordance with the second embodiment of the present invention.

As shown in FIG. 7, a conductor protective layer 60 is directly plated on the exposed surface of the metal layer 214 of the metal sacrificial structure 212 for protecting the predetermined suspension microstructure 211.

Figure 8:
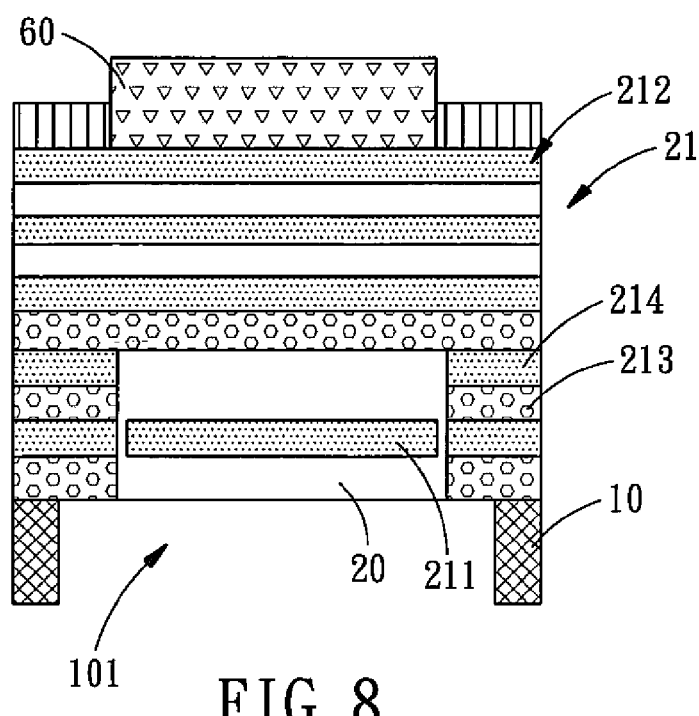
FIG. 8 is a cross sectional view showing a third step of the method for fabricating a microstructure in accordance with the second embodiment of the present invention.

As shown in FIG. 8, a reactive ion etching or a wet etching is subsequently carried out from the lower surface 12 of the silicon substrate 10 to directionally form a space 101 corresponding to the micro-electro-mechanical structure 21 in the silicon substrate 10. The space 101 extends to the insulation layer 20 and the metal sacrificial structure 212.

Figure 9:
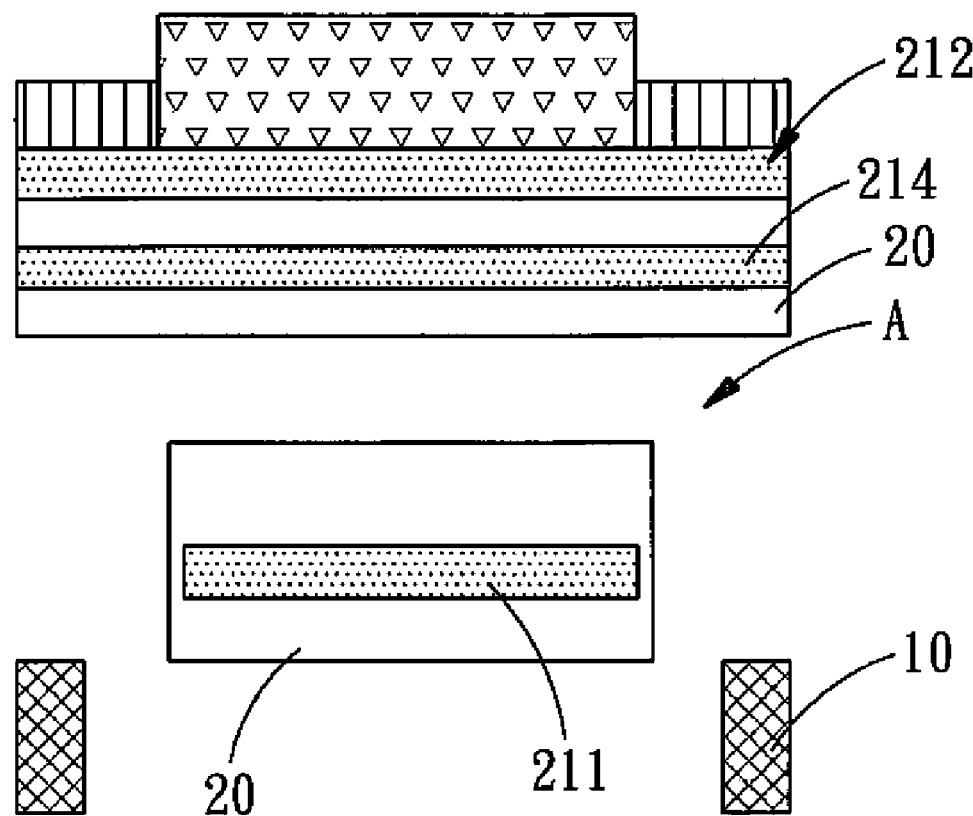
FIG. 9 is a cross sectional view showing a fourth step of the method for fabricating a microstructure in accordance with the second embodiment of the present invention.

As shown in FIG. 9, the metal sacrificial structure 212 of the insulation layer 20 is etched from the space 101 of the silicon substrate 10, and the metal via layers 213 around the microstructure 211 are removed, thus achieving the required suspension space A of the micro-electro-mechanical structure 21. The suspension space A is also a space of interaction of the metal sacrificial structure 212 with respect to the suspension microstructure 211. Moreover, at this moment, the surface of the microstructure 211 is still clad by the insulation layer 20, so the suspension microstructure 211 of the micro-electro-mechanical structure 21 still keeps in a good condition without being eroded. The barrier layer 40 and the conductor protective layer 60 are kept above the micro-electro-mechanical structure 21 to seal it.

The method for fabricating the microstructure in accordance with the second embodiment of the present invention has the following advantages:

1. Effectively avoiding undercut (as described above);
2. reducing the exposure and possibility of damage of the micro-electro-mechanical structure (as described above);
3. Effectively reducing the package cost (as described above);
4. Since a conductor protective layer 60 is plated over the exposed surface of the metal layer 214 of the metal sacrificial structure 212, and the conductor protective layer 60 complies with a process of a common standard conductive chip structure and can directly act as an electrical connection part of a circuit and finish the package operation.

By using the exposed surface of the metal layer 214 of the metal sacrificial structure 212 as a plating substrate, the conductor protective layer 60 can be directly fabricated over the exposed surface of the metal layer 214 of the metal sacrificial structure 212. The conductor protective layer 60 can be electrically conducted by a common standard chip structure and synchronously protect the microstructure 211 therein, without affecting the original design of the micro-electro-mechanical structure.

To summarize, a method for fabricating a microstructure in accordance with the present invention is to form at least one insulation layer including a micro-electro-mechanical structure therein over an upper surface of a silicon substrate. The micro-electro-mechanical structure includes at least one microstructure and a metal sacrificial structure that are independent with each other. In the metal sacrificial structure are formed a plurality of metal layers and a plurality of metal via layers connected with the respective metal layers. A barrier layer is formed over an upper surface of the insulation layer. Subsequently, an etching stop layer is formed over a lower surface of the silicon substrate. An etching operation is conducted from the lower surface of the silicon substrate to form a space corresponding to the micro-electro-mechanical structure, and then the metal sacrificial structure is etched, thus realizing a microstructure suspension.

Thereby, the microstructure and its surrounding can be effectively prevented from the improper erosion, and the probability of exposing and damaging the micro-electro-mechanical structure is lower, and further the micro-electro-mechanical structure can be integrated and packed with a common integrated circuit to reduce the package cost.

While we have shown and described various embodiments in accordance with the present invention, it is clear to those skilled in the art that further embodiments may be made without departing from the scope of the present invention.

What is claimed is:

1. A method for fabricating a microstructure comprising the steps of:

forming at least one insulation layer over an upper surface of a silicon substrate, the insulation layer including an inner metal micro-electro-mechanical structure, the micro-electro-mechanical structure including at least one microstructure and at least one metal sacrificial structure that are independent with each other, the metal sacrificial structure including metal layers and metal via layers connected to the respective metal layers;

forming at least one barrier layer over an upper surface of the insulation layer;

forming an etching stop layer over a lower surface of the silicon substrate;

carrying out an etching operation from the lower surface of the silicon substrate to form a space corresponding to a predetermined suspension microstructure in the micro-electro-mechanical structure; and etching the metal sacrificial structure for forming a suspension space for the microstructure to achieve a microstructure suspension of the micro-electro-mechanical structure.

2. The method for fabricating a microstructure as claimed in claim 1, wherein the insulation layer is etched again after forming the suspension space for the microstructure, so as to expose the microstructure and the metal sacrificial structure for strengthening a sensing effect and to remove fine structure remains of an original etching.

3. The method for fabricating a microstructure as claimed in claim 1, wherein the micro-electro-mechanical structure includes at least one microstructure and metal sacrificial structures that are independent with each other, the metal sacrificial structure includes a plurality of metal layers and a plurality of metal via layers, the microstructure is clad by the insulation layer, and the metal via layers are located at all sides except a silicon substrate lower side, between the respective metal layers of the metal sacrificial structures and the microstructure are formed the respective metal via layers.

4. A method for fabricating a microstructure comprising the steps of:

forming at least one insulation layer over an upper surface of a silicon substrate, the insulation layer including an inner metal micro-electro-mechanical structure, the micro-electro-mechanical structure including at least one microstructure and at least one metal sacrificial structure that are independent with each other, the metal sacrificial structure including a plurality of metal layers and a plurality of metal via layers connected to the respective metal layers, the metal layer at a most outer side of the metal sacrificial structure being partially exposed outside the insulation layer;

forming a barrier layer over an upper surface of the insulation layer but not over the exposed metal layer of the metal sacrificial structure;

directly forming a conductor protective layer over the exposed metal layer of the metal sacrificial structure for carrying out a predetermined conducting operation;

carrying out an etching operation from a lower surface of the silicon substrate to form a space corresponding to the microstructure of the micro-electro-mechanical structure; and etching the metal sacrificial structure for forming a microstructure suspension.

5. The method for fabricating a microstructure as claimed in claim 4, wherein the insulation layer is etched again after forming a suspension space for the microstructure, so as to expose the microstructure and its surrounding for strengthening a sensing effect, and to remove fine structure remains of an original etching.

6. The method for fabricating a microstructure as claimed in claim 4, wherein the micro-electro-mechanical structure includes at least one microstructure and a plurality of metal sacrificial structures that are independent with each other, the microstructure is clad by the insulation layer, the metal via layers are located at all sides except a silicon substrate lower side, between the respective metal layers of the metal sacrificial structures and the microstructure are formed the respective metal via layers.

7. The method for fabricating a microstructure as claimed in claim 4, wherein the conductor protective layer is directly plated on the metal sacrificial structure by using the exposed surface of the metal sacrificial structure as a seed layer.

\* \* \* \* \*